United States Patent [19]
Rudolph

[11] Patent Number: 5,548,747
[45] Date of Patent: Aug. 20, 1996

[54] BIT STACK WIRING CHANNEL OPTIMIZATION WITH FIXED MACRO PLACEMENT AND VARIABLE PIN PLACEMENT

[75] Inventor: Jeffrey Rudolph, Lamoille County, Vt.

[73] Assignee: International Business Machines Corporation, Armonk, N.Y.

[21] Appl. No.: 385,294

[22] Filed: Feb. 10, 1995

[51] Int. Cl.$^6$ .................................................. G06F 15/00
[52] U.S. Cl. ........................... 395/500; 364/490; 364/491; 364/489; 437/48; 437/51; 257/409; 257/355; 395/800
[58] Field of Search ...................... 364/488, 489, 364/490, 491, 578; 395/500, 375, 800, 700, 600, 650, 182.06; 437/51, 48, 54, 60, 189; 257/409, 355, 211, 204, 477

[56] References Cited

U.S. PATENT DOCUMENTS

| | | | |
|---|---|---|---|
| 4,295,149 | 10/1981 | Balyoz et al. | 257/211 |
| 4,593,351 | 6/1986 | Hong et al. | 395/800 |
| 4,593,362 | 6/1986 | Bergeron et al. | 364/488 |
| 4,607,339 | 8/1986 | Davis | 364/491 |
| 4,890,238 | 12/1989 | Klein et al. | 364/491 |
| 4,896,272 | 7/1990 | Kurosawa | 364/491 |
| 4,988,636 | 1/1991 | Masleid et al. | 437/51 |
| 5,036,473 | 1/1991 | Butts et al. | 364/489 |
| 5,045,913 | 9/1991 | Masleid et al. | 257/409 |
| 5,051,994 | 9/1991 | Bluethman et al. | 395/182.06 |
| 5,218,551 | 6/1993 | Agrawal et al. | 364/491 |
| 5,224,057 | 6/1993 | Igarashi et al. | 364/490 |
| 5,225,991 | 7/1993 | Dougherty | 364/491 |
| 5,237,514 | 8/1993 | Curtin | 364/489 |
| 5,266,912 | 11/1993 | Kledzik | 333/247 |
| 5,303,161 | 4/1994 | Burns et al. | 364/489 |
| 5,308,798 | 5/1994 | Brasen et al. | 437/250 |
| 5,309,370 | 5/1994 | Wong | 364/490 |
| 5,353,234 | 10/1994 | Takigami | 364/489 |
| 5,353,235 | 10/1994 | Do et al. | 364/489 |
| 5,363,313 | 11/1994 | Lee | 364/491 |
| 5,367,469 | 11/1994 | Hartoog | 364/489 |
| 5,404,313 | 4/1995 | Shiohara et al. | 364/491 |

OTHER PUBLICATIONS

IBM Technical Disclosure Bulletin, vol. 30, No. 8, Jan. 1988, Cagle et al., pp. 303–309 "Traffic Evaluation for Dataflow Stacks in VLSI Chip Design".

Primary Examiner—Kevin J. Teska
Assistant Examiner—Jacques Louis-Jacques
Attorney, Agent, or Firm—Whitham, Curtis, Whitham & McGinn; Susan M. Murray

[57] ABSTRACT

Wiring channel assignment in very large scale integrated (VLSI) bit stack macros is optimized for fixed macro placement and variable pin placement. Nets are first prioritized by length with the longest nets having highest priority. Nets are then routed between the appropriate macros according to their priority. Pin rails or position are assigned dynamically, rather than being predetermined, as the nets are being placed with a preference towards the nearest edge of the macro, in order to minimize net length and maximize sharing of wiring channels among multiple nets.

13 Claims, 8 Drawing Sheets

BIT STACK WIRING CHANNEL OPTIMIZATION WITH FIXED MACRO PLACEMENT AND VARIABLE PIN PLACEMENT

BACKGROUND OF THE INVENTION

1. Field of the Invention

The present invention generally relates to methods for automatically placing pins and wiring a bit stack and, more particularly, to a method for bit stack channel wiring optimization in very large scale integrated (VLSI) bit stack design that provides an optimal or near-optimal solution, given a fixed bit stack macro placement order and combination of fixed and/or variable pin placements within each bit stack macro.

2. Description of the Background Art

In VLSI design, dataflow stacks are a series of bit-oriented macros placed on top of each other. Stacks normally consist of "structured" macros, such as data registers, multiplexers and arithmetic logic units (ALUs), usually custom-designed per bit. Bits are replicated horizontally as needed. Macros are stacked vertically to form the data flow. The inputs and outputs (I/Os) of the stack macros tend to be grouped by bit; that is, the output of, say, the third bit of a data register tends to be input to the third bit of a multiplexer, for example. Poor ordering of stack macros may not be wirable within the given circuit area constraints. Alternately, poor ordering may result in increased in stack size for wirability at the expense of die size and circuit performance.

To assist designers in this process, automated pin placement and wiring methods have been developed and implemented in computer programs. Most existing stack optimizers use total line crossings at each macro boundary to evaluate the wirability of a given stack ordering. Some assume that all bits within a macro stack are identical in size and solve the stack ordering problem by optimizing a single bit. Stacks optimized using the prior evaluation methods often have wiring overflows. Alternative approaches to the problem of optimizing wiring channels for bit stacks include manual methods or an existing knowledge optimization algorithm. Modern microprocessors contain many data stacks with various sizes, further complicating the optimization problem. Without an improved optimization algorithm and software implementation, the bit stack optimization of microprocessors is very time-consuming and error prone. Moreover, the prior art does not permit partial physical design of VLSI bit stacks prior to the availability of pin placement information. Nor does the prior art permit determining pin placements that aid bit stack wiring channel optimization.

In one approach known to the applicant, macros are moved one at a time to a "best" position, starting at the top of the order of macros. This "best" position minimizes the summation of the length of only the busses which connect to that macro. When applied throughout the stack, the process causes macros to "pull" each other together based on their interconnectivity. During this process, a subset of macros may get into a repeating order of loop. This subset of macros in the loop are grouped together and treated as a single macro. By ignoring the interconnections between the macros in the group, the group is then pulled to its optimum place in the current order. This approach relates strictly to macro placement and does not guarantee a solution that minimizes the number of wiring channels since it does not guarantee the solution is wirable. Moreover, this approach does not address the variability that exists in pin placement and how actual pin placement within macros can be used to further reduce wiring channels compared to solutions arrived at using macros with fixed pin placements.

SUMMARY OF THE INVENTION

It is therefore an object of the present invention to provide a method that generates an optimal solution to a wiring channel assignment in VLSI circuit design with fixed macro placement and variable pin placement.

It is another object of the invention to provide a method to optimize bit stack designs consisting of fixed macro positions and fixed or variable pin placements in VLSI circuits.

According to the invention, there is provided a method which, for a given fixed ordering of a set of bit stack macros and a definition of the interconnected nets, determines a pin placement and channel allocation within the bit stack macros such that the minimum number of wiring channels are consumed. Nets are first prioritized by length with the longest nets having highest priority. Nets are then routed between the appropriate macros according to their priority. Pin rails or positions are assigned dynamically, if not already predetermined, as the nets are being placed with a preference towards the nearest edge of the macro, in order to minimize net length and maximize sharing of wiring channels among multiple nets.

The wiring channel optimization algorithm implemented by the method according to the invention provides faster, more robust, and less error-prone results than manual methods. Moreover, the method according to the invention is more robust than existing automated methods of prioritizing pin-pairs for subsequent channel allocation since the present invention does not require pre-placed pins within each bit stack macro.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
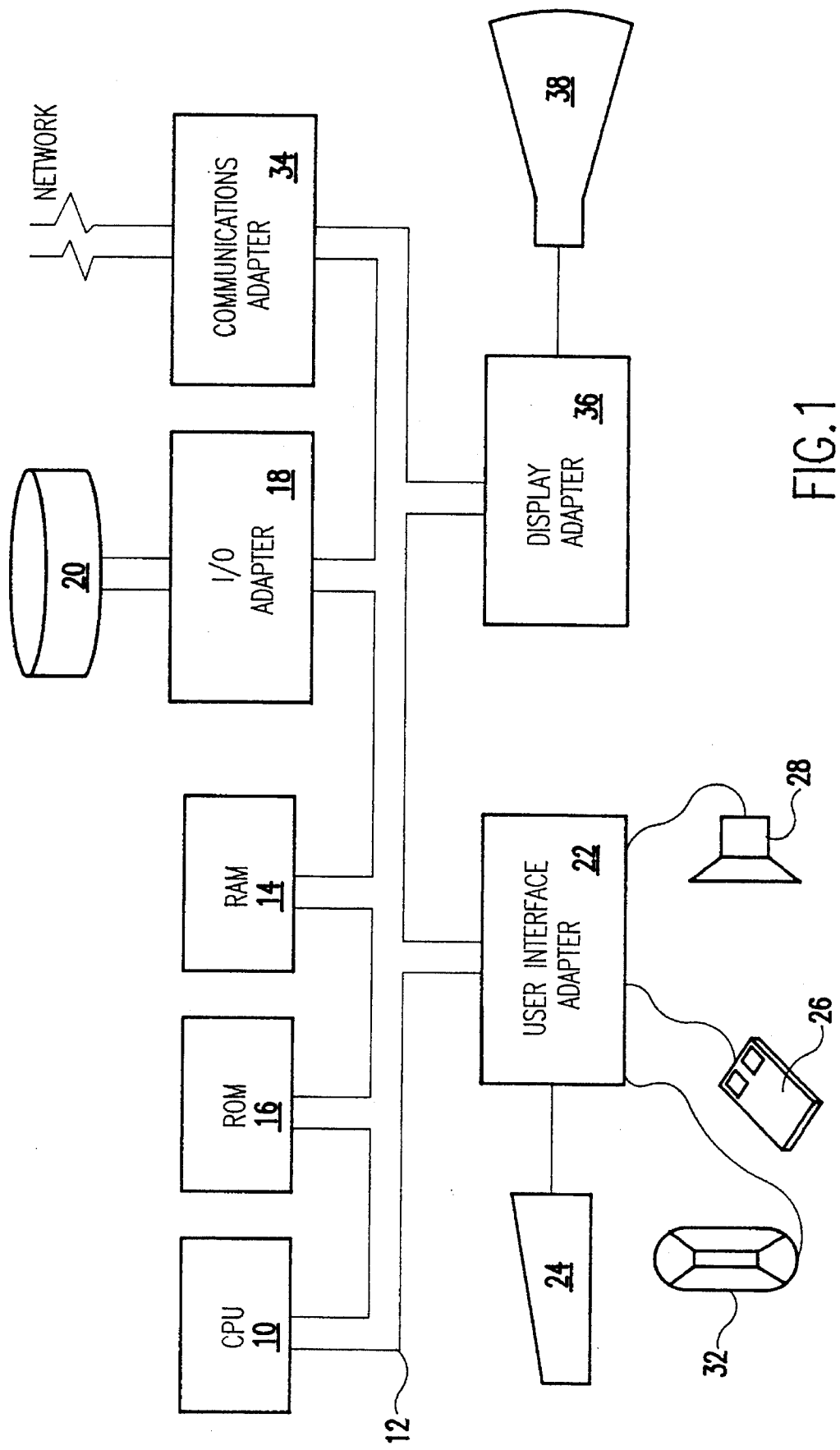
FIG. 1 is a block diagram showing a hardware configuration on which the subject invention may be implemented.

Referring now to the drawings, and more particularly to FIG. 1, them is shown a representative hardware environment on which the subject invention may be implemented. This hardware environment may be a personal computer, such as the International Business Machines (IBM) Corporation's PS/2 family of Personal Computers, or a workstation, such as IBM's RS/6000 Workstation. The hardware includes a central processing unit (CPU) 10, which may conform to Intel's X86 architecture or may be a reduced instruction set computer (RISC) microprocessor such as IBM's PowerPC microprocessor. The CPU 10 is attached to a system bus 12 to which are attached a read/write or random access memory (RAM) 14, a read only memory (ROM) 16, an input/output (I/O) adapter 18, and a user interface adapter 22. The RAM 14 provides temporary storage for application program code and date, while ROM 16 typically includes the basic input/output system (BIOS) code. The I/O adapter 18 is connected to one or more Direct Access Storage Devices (DASDs), here represented as a disk drive 20. The disk drive 20 typically stores the computer's operating system (OS) and various application programs, each of which are selectively loaded into RAM 14 via the system bus 12. The user interface adapter 22 has attached to it a keyboard 24, a mouse 26, a speaker 28, a microphone 32, and/or other user interface devices (not shown). The personal computer or workstation also includes a display 38, here represented as a cathode ray tube (CRT) display but which may be a liquid crystal display (LCD) or other suitable display. The display 38 is connected to the system bus 12 via a display adapter 34. Optionally, a communications adapter 34 is connected to the bus 12 and to a network, for example a local area network (LAN), such as IBM's Token Ring LAN. Alternatively, the communications adapter may be a modem connecting the personal computer or workstation to a telephone line as part of a wide area network (WAN).

The preferred embodiment of the invention is implemented on a hardware platform as generally shown in FIG. 1. The process according to the invention will now be described by way of flow diagrams and a specific example.

Figure 2:
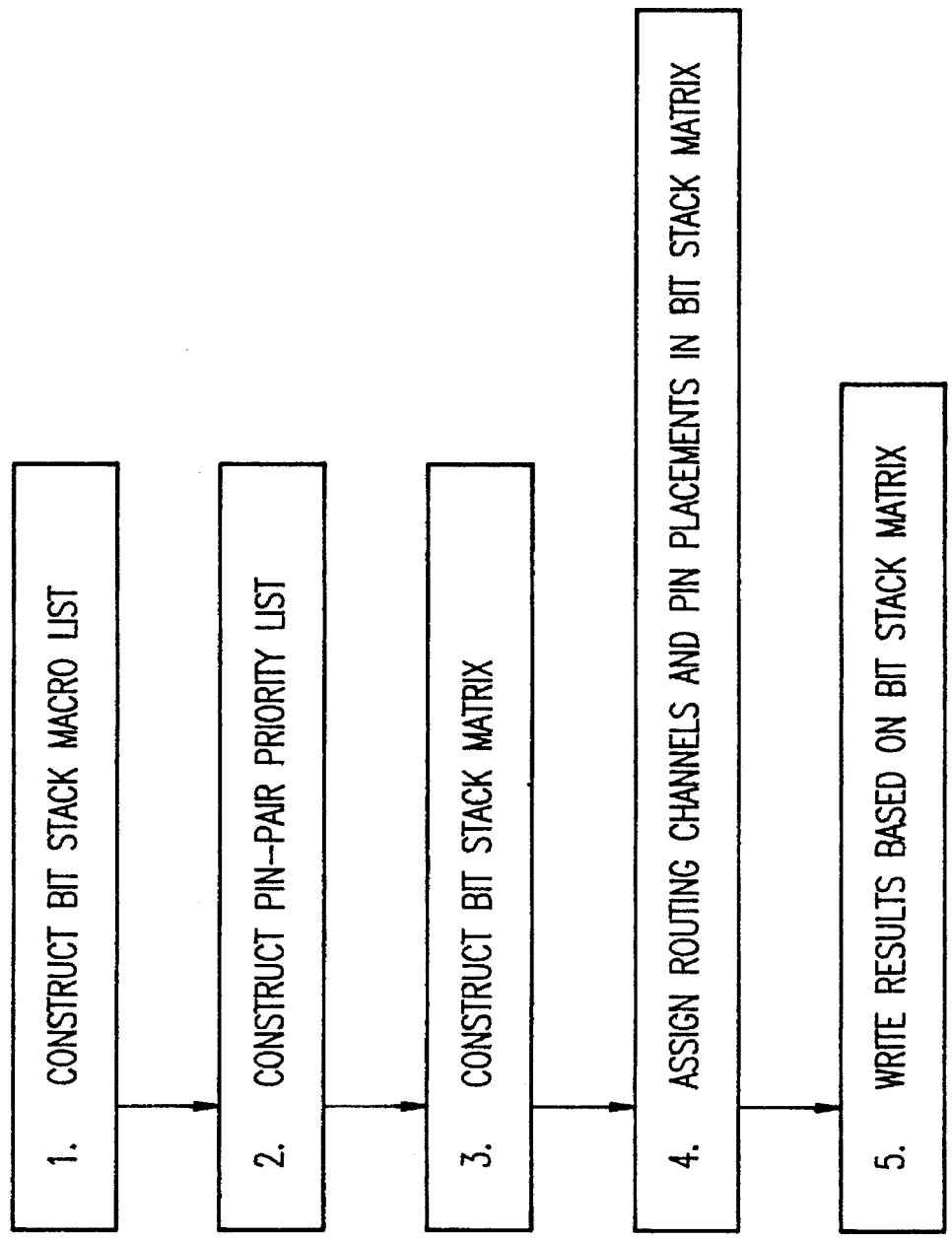
FIG. 2 is a top-level flow diagram showing the basic steps in the method according to the invention.

FIG. 2 shows a top-level flow diagram of a preferred software implementation of the invention which may be run on a PC or workstation as generally shown in FIG. 1. In the first step, data files are input. From this input, a bit stack macro list is constructed and sorted by y-axis position. A net list is also constructed. This list includes each pin in the overall chip design. The next step is to build a pin-pair priority queue from the net list input in step one. The macro membership for each pin in the net list is determined. Then all pin-pairs are added where one or both pins are members of a bit stack macro. Each pin-pair is prioritized by pin-to-pin distance; i.e., longest-to-shortest (actual if available, estimated otherwise). The third step is to define a chip structure to represent the problem space. Two layers are used, one for pins and the other for wiring channels. The size is defined as an N×M bit stack matrix, where N is the number of nets and M is the number of pins. Any blockages defined in input pre-wires are applied. In the fourth step, for each pin-pair in the priority queue, a determination is made as to whether pins already exist in the chip structure. If pins already exist, then pin rails are created for each pin and routed with a "pattern matching" router to obtain the shortest connecting path. Since the algorithm used is routing from longest-to-shortest, a minimal wire channel allocation results. Finally, in the fifth step, an output results file is generated by writing a net map, including wires and pins, and writing net wires.

Figure 3:
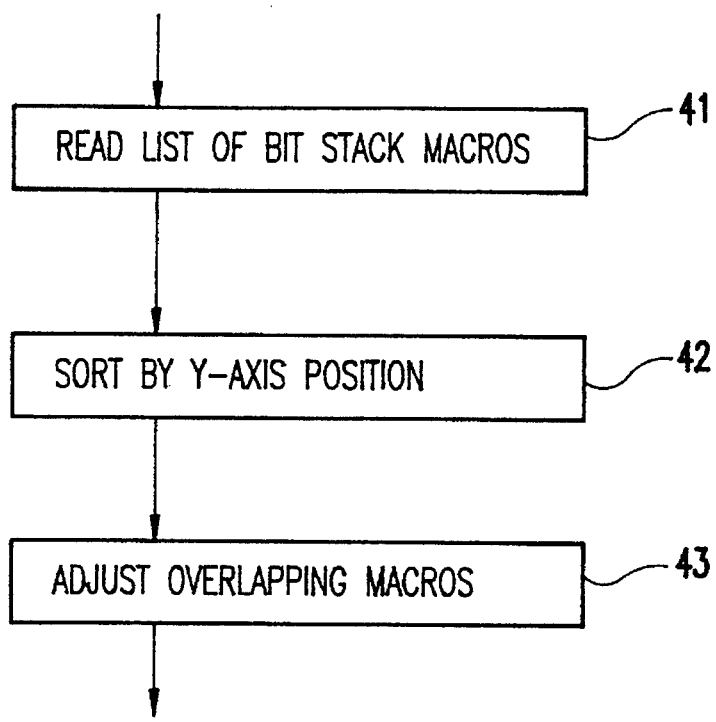
FIG. 3 is a detailed flow diagram of the first step of the flow diagram shown in FIG. 2.

The first step of the process shown in FIG. 2 is shown in more detail in FIG. 3, to which reference is now made. In function block 41, the input list of bit stack macros is read. This data includes the macro name, macro dimensions, and relative or absolute placement information. Next, in function block 42, the bit stack macro list is read by y-axis positions in ascending order. The resulting list is ordered from bottom-most to top-most macro. Then in function block 43, the macro list dimensions are adjusted as needed (and if permitted) to prevent overlapping macros.

Figure 4:
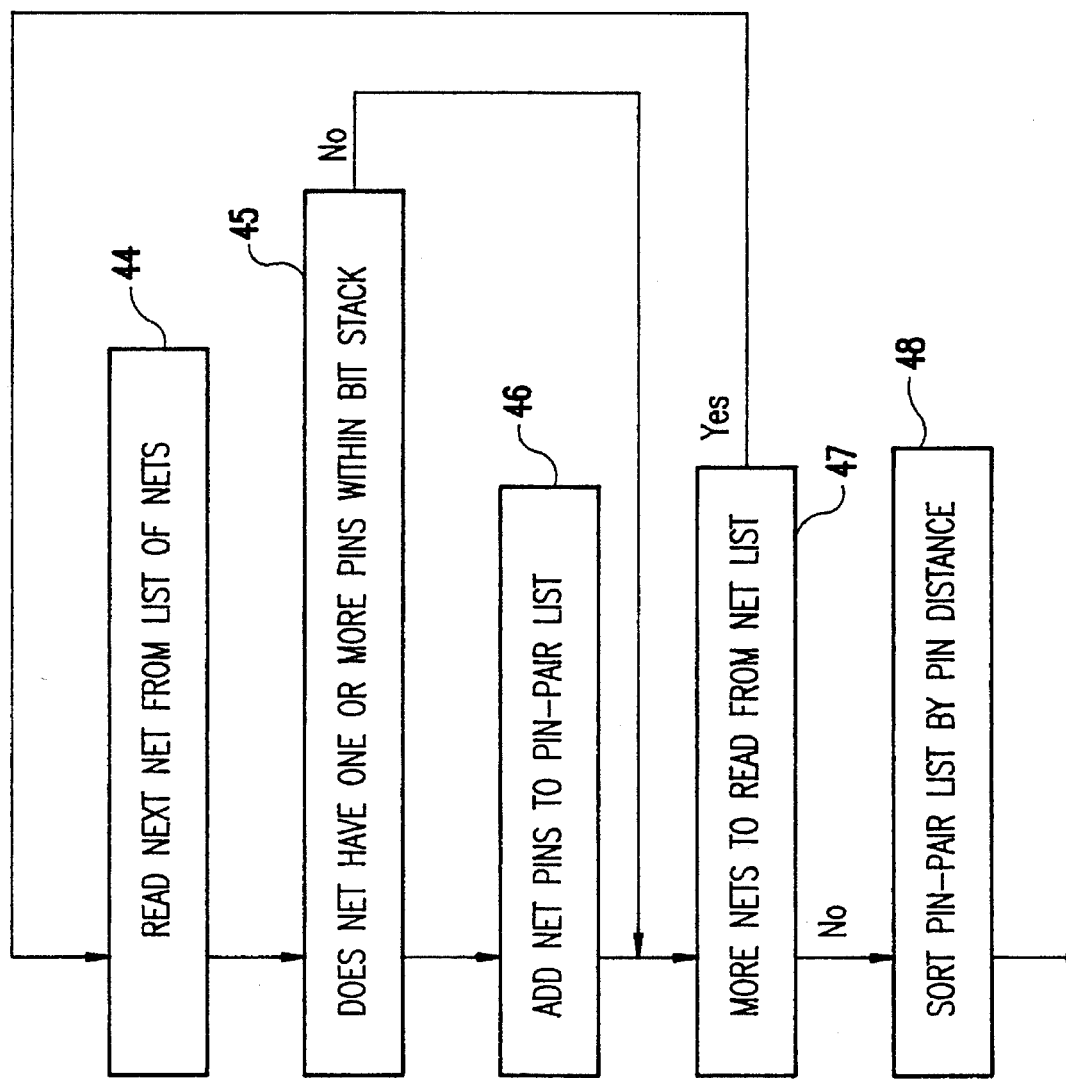
FIG. 4 is a detailed flow diagram of the second step of the flow diagram shown in FIG. 2.

The second step of the process shown in FIG. 2 is shown in more detail in FIG. 4, to which reference is now made. In function block 44, the next net from the list of nets is read. Each net includes the relationship between the net and its associated pins. Also, each pin should be associated with exactly one macro, although the macro may not necessarily be one of the bit stack macros. Optionally, any net pin may be pre-placed with its macro. In decision block 45, a test is made to determine if all pins in each net are members within a macro from the bit stack macro list. If so, the procedure goes to function block 46, but if not, function block 46 is skipped. In function block 46, for each pin found within a bit stack macro, an iteration is made for every other pin in the net, adding a pin-pair to a pin-pair list. The pin-pairs should be ordered such that the first pin is from the lower-most of the two macros and the second pin is from the upper-most of the two macros. A test is then made in decision block 47 to determine if there are more nets to be read from the net list and, if so, the process loops back to function block 44 to process the next net in the net list. When all nets have been read from the net list and processed, the pin-pair list is sorted by pin-to-pin distance in descending order in function block 48. The pin-to-pin distance may be based on manhattan distance, euclidean distance or other such similar measure. The pin placement used to derive distance can be obtained from one of two sources. The pin placement may be initially defined in the case of pre-placed pins. For unplaced or variable pins, the position can be approximated to the geometric center of the bit stack macro within which the pin is contained. The resulting list should be ordered from farthest distance to nearest distance.

Figure 5:
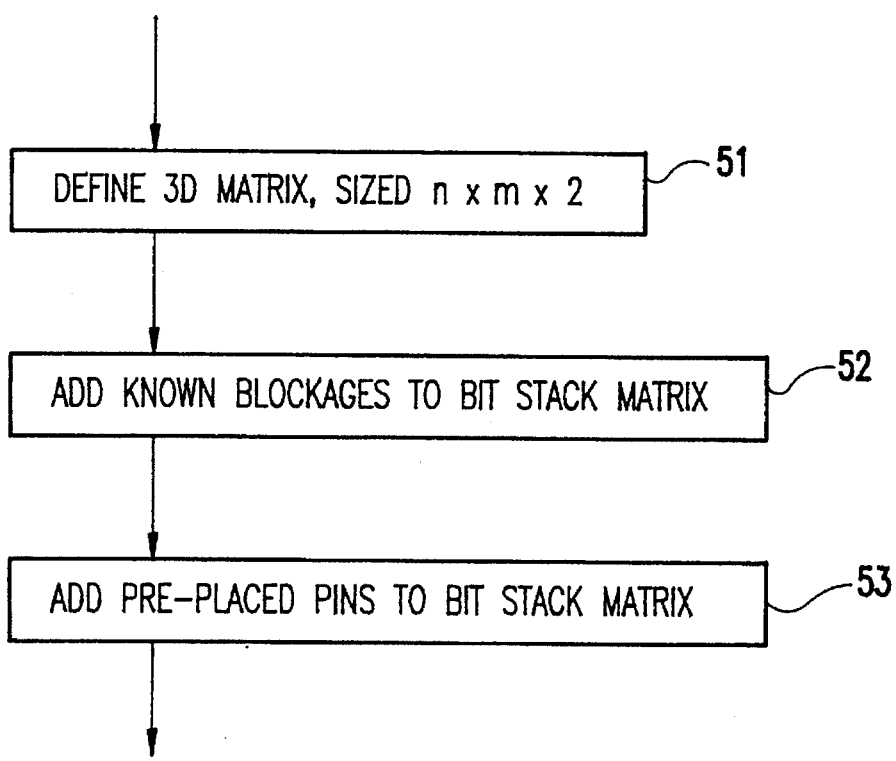
FIG. 5 is a detailed flow diagram of the third step of the flow diagram shown in FIG. 2.

The third step of the process shown in FIG. 2 is shown in more detail in FIG. 5, to which reference is now made. In function block 51, a three dimensional (3D) matrix is defined with size M×N×2. The matrix may be implemented as an array structure, tree or set of linked lists. The width "N" is a product of the number of routing layers available in the bit stack design and the bit stack width. The height "M" is based on the bit stack height. Two layers are allocated, a horizontal layer used for bit stack macros and a vertical layer used for wiring channels. In function block 52, any known blockages may be added to the bit stack matrix to inhibit subsequent wiring channel and pin position allocations. And in function block 53, any known pin placements within the bit stack macros may also be added. These pre-placed pins may be used to restrict subsequent pin position and/or wiring channel assignments.

Figure 6:
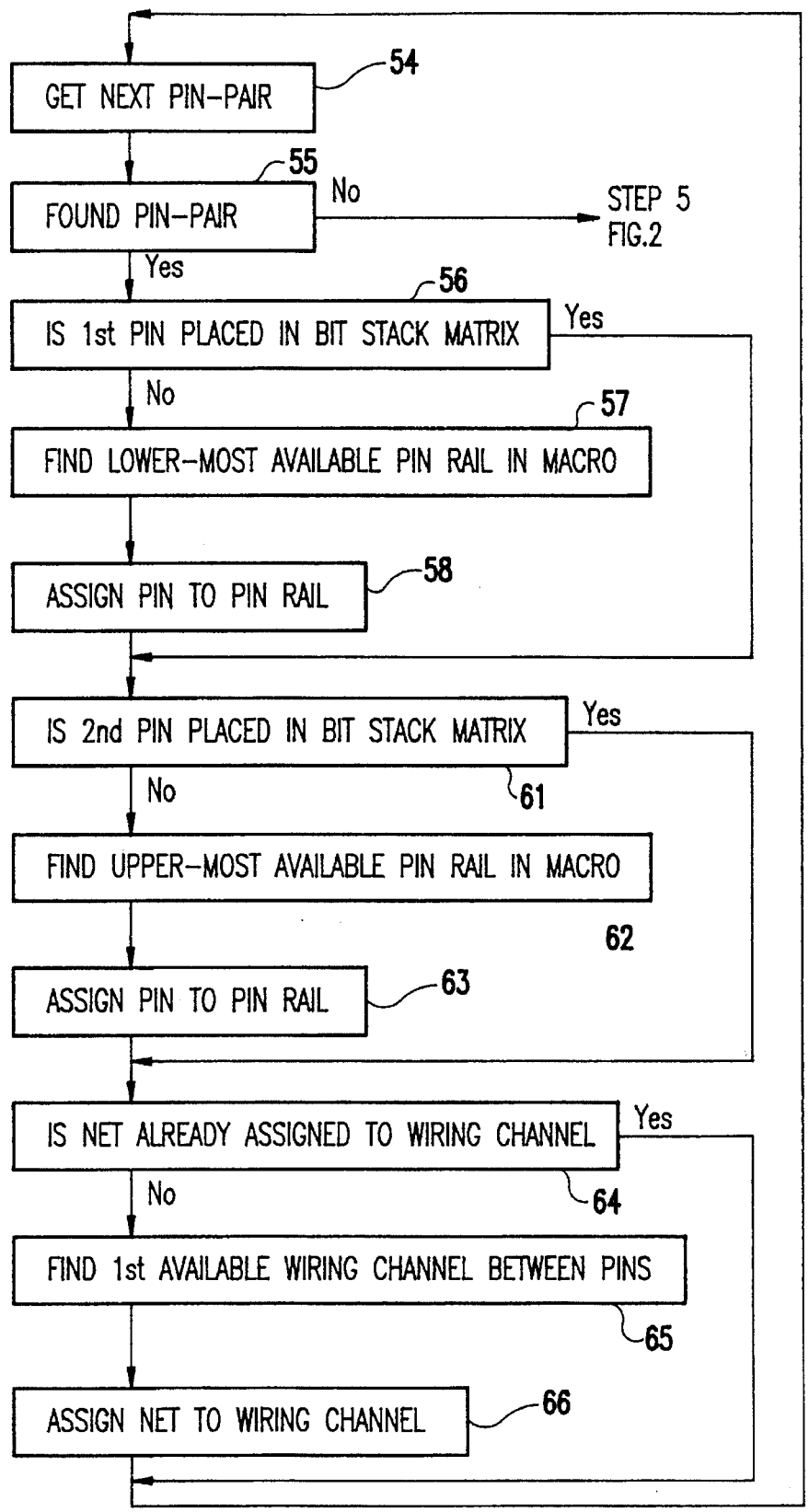
FIG. 6 is a detailed flow diagram of the fourth step of the flow diagram shown in FIG. 2.

The fourth step of the process shown in FIG. 2 is shown in more detail in FIG. 6, to which reference is now made. In function block 54, the next pin-pair is retrieved from the ordered pin-pairs. Then a test is made in decision block 55 to determine if a pin-pair was found; that is, have all pin-pairs been processed? If there is another pin-pair to be processed, the process goes to decision block 56 where a test is made to determine if the first pin in the pin-pair has already been placed within its corresponding instance. A pin may have been previously placed if it was initially fixed or if it was a member of a previous pin-pair. If so, the next two function blocks 57 and 58 are skipped; otherwise, in function block 57, the "optimal" placement is found by searching the pin's macro for the first available pin rail. A pin rail is defined to be a horizontal row with no existing pins. The search begins at the top of the macro, moving downwards to the bottom of the macro. If no empty rows are found (due to blockage or existing pins), a pin rail may be defined to be a partially available row. Next, in function block 58, a horizontal pin rail is allocated to the pin. Later, after all pins have been placed in a pin rail and wiring channels have been allocated, the pin rail may be reduced to a single pin position. In decision block 59, a test is made to determine if the second pin of the pin-pair has already been placed within its corresponding instance. If so, the next two function blocks 61 and 62 are skipped; otherwise, the "optimal" placement of the second pin is found in function block 61 by searching the pin's macro for the first available pin rail. The search begins at the bottom of the macro, moving upwards to the top of the macro. Then in function block 62, pin rail is allocated to this pin. A further test is made in decision block 63 to determine whether this pin-pair's net has already been assigned to a vertical wiring channel. A net may have been assigned to a wiring channel if it was a pre-wire or if it was assigned by a previous pin-pair. If the pin-pair's net has been assigned to a vertical wiring channel, the next two function blocks 64 and 65 are skipped; otherwise, a search is made in function block 64 for the first available vertical wiring channel that spans between the pins. Then in function block 65, the net associated with this pin-pair is assigned to the next available wiring channel. The process then loops back to function block 54 to retrieve the next pin-pair. When it is determined in decision block 55 that all pin-pairs have been processed, the routine exits to step five in FIG. 2.

Figure 7:
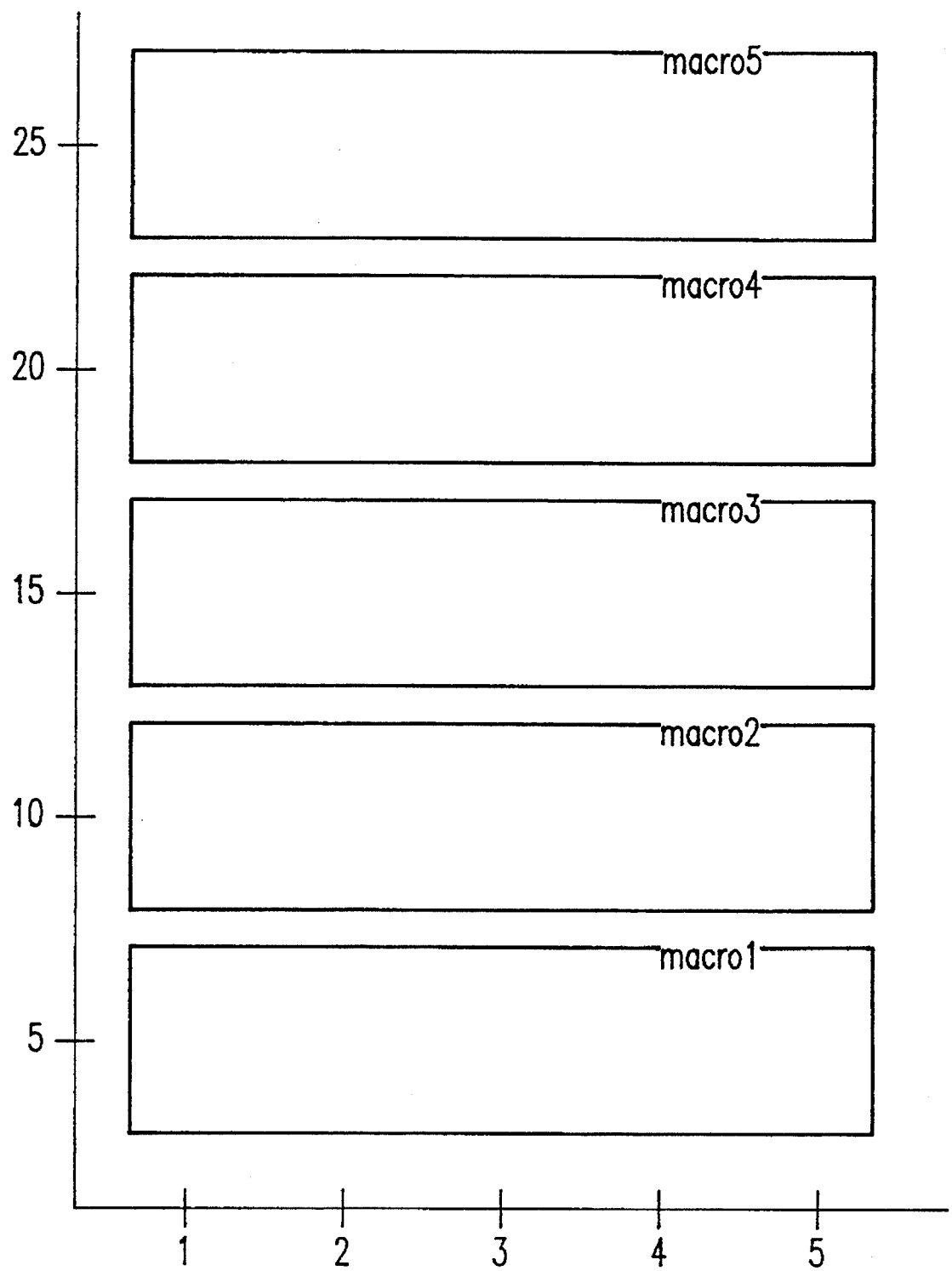
FIG. 7 is a block diagram showing size and relative position for five example bit stack macros.

In the following example, shown in FIGS. 7 to 11, there is provided an illustration of the bit stack wiring channel optimization procedure described above. Assume a bit stack design with five macros, sized and positioned as shown in FIG. 7. Assume further all pin positions within macros are variable or undefined initially for purposes of this example, although it will be understood that the procedure according to the invention handles pre-placed pins as well. Assume also that a net list corresponding to these bit stack macros is as shown in Table 1, below:

TABLE 1

| Net Name | Pin Name | Macro Name |
|---|---|---|
| Net A | pinA_2 | macro2 |
|  | pinA_3 | macro3 |
|  | pinA_5 | macro5 |
| Net B | pinB_3 | macro3 |
|  | pinB_5 | macro5 |
| Net C | pinC_1 | macro1 |
|  | pinC_3 | macro3 |
| Net D | pinD_1 | macro1 |
|  | pinD_2 | macro2 |

TABLE 1-continued

| Net Name | Pin Name | Macro Name |
|---|---|---|
| Net E | pinE_2 | macro2 |
|  | pinE_4 | macro4 |

The above net list comprises the connectivity for pins within the macros shown in FIG. 7. For example, Table 1 defines that Net A connects pinA_2 in macro2 with pinA_3 in macro3 with pinA_5 in macro5.

Based on the net list of Table 1, a pin-pair list is constructed as shown in Table 2 below:

TABLE 2

| Distance | Pin/Macro | Pin/Macro | Net Name |
|---|---|---|---|
| 15 | pinA_2/macro2 | pinA_5/macro5 | Net A |
| 10 | pinC_1/macro1 | pinC_3/macro3 | Net C |
| 10 | pinE_2/macro2 | pinE_4/macro4 | Net E |
| 10 | pinA_3/macro3 | pinA_5/macro5 | Net A |
| 10 | pinB_3/macro3 | pinB_5/macro5 | Net B |
| 5 | pinD_1/macro1 | pinD_2/macro2 | Net D |
| 5 | pinA_2/macro2 | pinA_3/macro3 | Net A |

The list in Table 2 is ranked by pin-to-pin distance, either estimated or actual. Since the example assumes no pins have been pre-placed within macros, pins are assumed at the geometric center of each macro for calculating pin-to-pin distances. For example, pin-pair pinA_2-pinA_5 spans from macro2 to macro5. Based on the macro placement shown in FIG. 7, the distance between these pins is estimated at 15 units. The pin-pair list is prioritized by distance, with tie values being arbitrated based on macro order such that lower-placed macros are assigned a higher priority. For example, pin pairs pinC_1-pinC_3 and pinE_2-pinE_4 both have a distance value of 10 units. Pin pair pinC_1-pinC_3 is ranked with a higher priority since it is placed lower within the bit stack.

Figure 9:
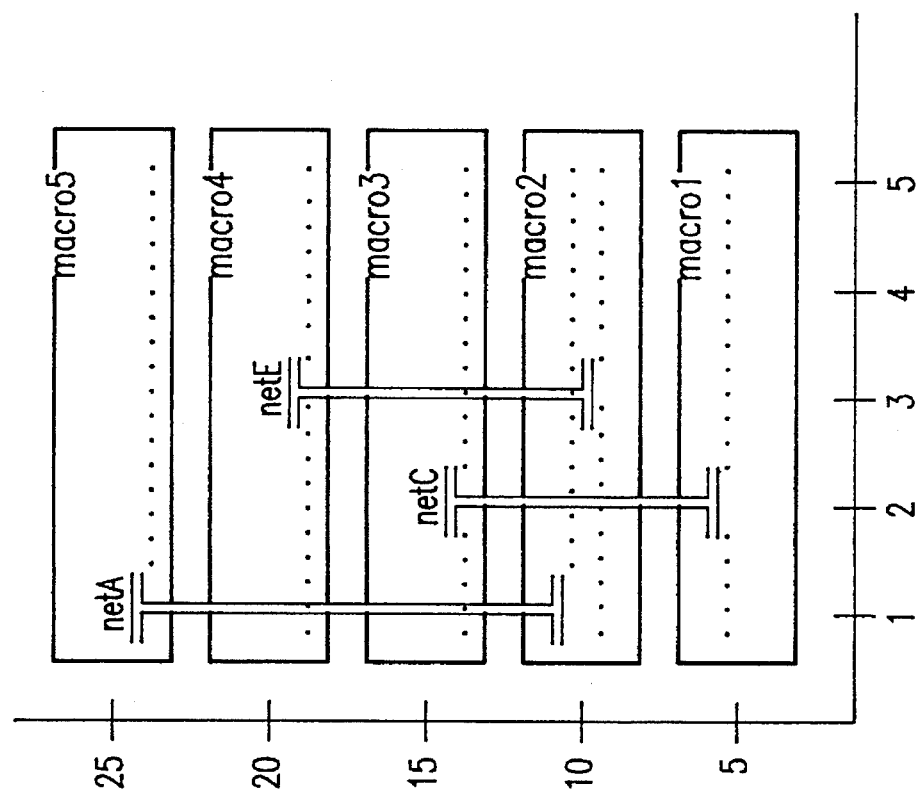
FIG. 9 is a block diagram showing pin position and wiring channel for the second and third pin-pairs of the example shown in FIG. 7.
Figure 8:
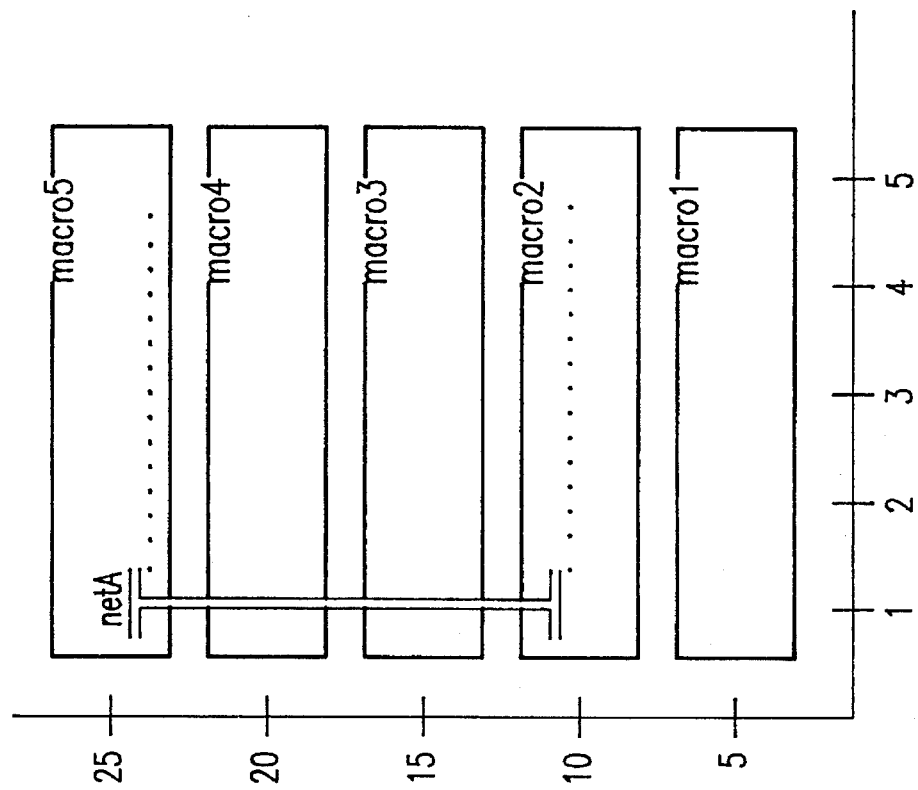
FIG. 8 is a block diagram showing pin position and wiring channel for the first pin-pair of the example shown in FIG. 7.

The process begins by extracting the first pin-pair from the pin-pair list and reserving pin rails as shown in FIG. 8. In this example pinA_2 is allocated the upper-most available horizontal rail in macro2, and pinA_5 is allocated to the lower-most available horizontal pin rail in macro5. Following pin rail allocation, the first available vertical path between pins pinA_2 and pinA_5 is found. The result is a set of pin positions and wiring channel allocation for Net A. The process continues by extracting the second and third pin-pairs from the pin-pair list, allocating pin rails and solving channel allocation based on the pins as shown in FIG. 9. In FIG. 9, pinC_1 is allocated the upper-most available pin rail in macro1, and pinC_3 is allocated the lower-most available pin rail in macro3. The first available vertical path between pins pinC_1 and pinC_3 is determined to be wiring channel number 2. When the third pin-pair is solved, the upper-most pin rail in macro2 is already reserved for use by pinA_2, thus forcing pinE_2 to use the second upper-most pin rail.

Figure 11:
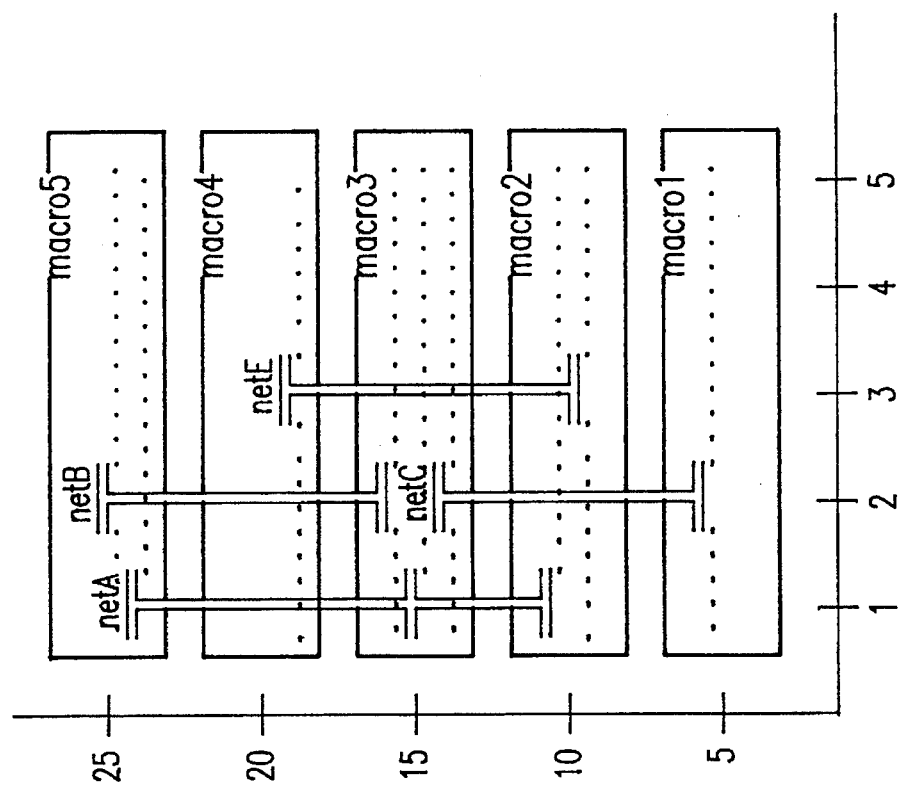
FIG. 11 is a block diagram showing pin position and wiring channels for the fifth, sixth and seventh pin-pairs of the example shown in FIG. 7.
Figure 10:
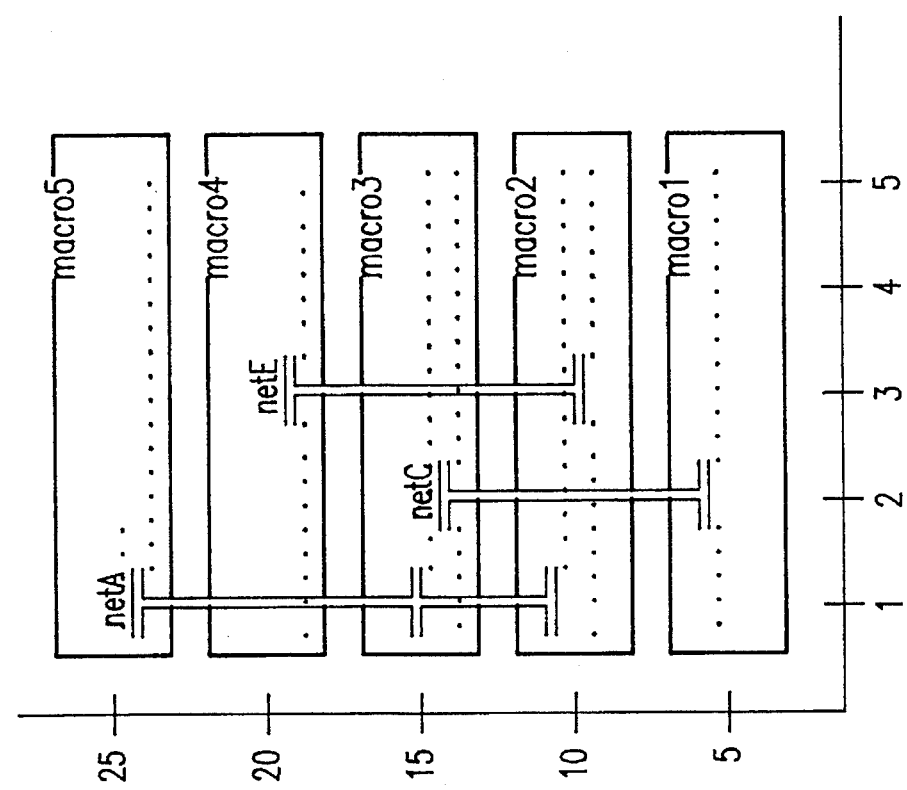
FIG. 10 is a block diagram showing pin position and wiring channel for the fourth pin-pair of the example shown in FIG. 7.

The process continues, extracting and solving the fourth pin-pair as shown in FIG. 10. In this case, Net A has already been solved and pinA_5 has already been located in macro5. The process locates pinA_3 at the next available pin rail within macro3. In this example, the next available pin rail is located by testing for available horizontal rails from the center of macro3 outward. The process terminates after extracting and solving the remaining pin-pairs, as shown in FIG. 11. The resulting wiring channel allocation has been optimized, minimizing the number of channels required. Simultaneously, pin positions have been determined such that the number of wiring channels has been minimized.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A computer implemented method of very large scale integrated (VLSI) circuit design which, for a given fixed ordering of a set of bit stack macros and a definition of interconnected nets, determines a pin placement and channel allocation within bit stack macros such that a minimum number of wiring channels are consumed, said method comprising the steps of:

prioritizing nets by length with longest nets having highest priority;

routing nets between appropriate macros according to their priority; and dynamically assigning pin rails as the nets are being placed with a preference towards a nearest edge of a macro in order to minimize net length and maximize sharing of wiring channels among multiple nets.

2. A computer implemented method of very large scale integrated (VLSI) circuit design as recited in claim 1 wherein at least some of the bit stack macros have variable pin placements and the step of dynamically assigning assigns pin positions within macros with variable pins such that the number of wiring channels required is minimized.

3. A computer implemented method for automatically optimizing bit stack channel wiring for very large scale integrated (VLSI) bit stack design comprising the steps of:

constructing a list of bit stack macros, ordered by relative position from bottom-most position macro to top-most position macro in said list;

constructing a list of pin-pairs based on nets connecting between bit stack macros and other stack macros such that all pin-pairs should contain at least one pin which is a member of a bit stack macro;

prioritizing the pin-pairs by length such that pin-pairs separated by the largest distance have highest priority;

constructing a bit stack matrix used to describe macro placements, pin positions and wiring channel assignments; and iteratively assigning each pin from each pin-pair to a macro placement, as needed, and assigning a net corresponding to each pin-pair to a wiring channel, as needed.

4. A computer implemented method for automatically optimizing bit stack channel wiring for very large scale integrated (VLSI) bit stack design as recited in claim 3 wherein step of constructing a bit stack matrix comprises the steps of:

defining a horizontal layer to describe bit stack macros including any known pin placements and blockages; and defining a vertical layer to describe bit stack wiring channels including any known wiring channel assignments.

5. A computer implemented method for automatically optimizing bit stack channel wiring for very large scale integrated (VLSI) bit stack design as recited in claim 3 wherein the step of iteratively assigning comprises the steps of:

assigning pins to a nearest edge of each macro such that a distance between pins in each pin-pair is minimized; and assigning nets to wiring channels for each pin-pair such that a next available wiring channel is allocated.

6. A method for automatically optimizing bit stack channel wiring for very large scale integrated (VLSI) bit stack design on a computer comprising the steps of:

inputting data files defining bit stack macros of a VLSI chip;

constructing a bit stack macro list sorted by y-axis position in the VLSI bit stack design;

constructing a net list including each pin in an overall VLSI bit stack design;

defining a VLSI chip structure to represent a problem space using two layers, one for pins and the other for wiring channels, the problem space being defined as an N×M bit stack matrix, where N is the number of nets and M is the number of pins;

assigning routing channels and pin placements in the bit stack matrix by determining whether pins already exist in the chip structure for each pin-pair in the priority queue, and if pins already exist, then creating pin rails for each pin and routing with a "pattern matching" router to obtain a shortest connecting path; and generating an output results file by writing a net map, including wires and pins, and writing net wires.

7. A method for automatically optimizing bit stack channel wiring for very large scale integrated (VLSI) bit stack design on a computer as recited in claim 6 wherein the step of constructing a bit stack macro list sorted by y-axis position in the VLSI bit stack design comprises the steps of:

reading an input list of bit stack macros, including a macro name, macro dimensions, and relative or absolute placement information to generate a bit stack macro list;

reading the bit stack macro list by y-axis positions in ascending order to generate a list is ordered from bottom-most to top-most macro; and adjusting macro list dimensions as needed to prevent overlapping macros.

8. A method for automatically optimizing bit stack channel wiring for very large scale integrated (VLSI) bit stack design on a computer as recited in claim 6 wherein the step of constructing a net list comprises the step of building a pin-pair priority queue from the net list, macro membership for each pin in the net list being first determined and then all pin-pairs being added where one or both pins are members of a bit stack macro, each pin-pair being prioritized by actual longest-to-shortest pin-to-pin distance if available or estimated longest-to-shortest pin-to-pin distance if actual distances are not available.

9. A method for automatically optimizing bit stack channel wiring for very large scale integrated (VLSI) bit stack design on a computer as recited in claim 8 wherein the step of building a pin-pair priority queue comprises the steps of:

reading a next net from a list of nets, each net including a relationship between the net and its associated pins, each pin being associated with exactly one macro, although the one macro may not necessarily be one of the bit stack macros;

determining if all pins in each net are members within a macro from the bit stack macro list, and if so, performing an iteration for each pin found within a bit stack macro for every other pin in the net and adding a pin-pair to a pin-pair list;

ordering the pin-pairs in the pin-pair list such that a first pin is from the lower-most of the two macros and a second pin is from the upper-most of the two macros;

determining if there are more nets to be read from the net list and, if so, processing a next net in the net list until all nets have been read from the net list and processed; and sorting the pin-pair list by pin-to-pin distance in descending order from farthest distance to nearest distance.

10. A method for automatically optimizing bit stack channel wiring for very large scale integrated (VLSI) bit stack design on a computer as recited in claim 9 wherein the step of defining a VLSI chip structure comprises the steps of:

defining a three dimensional (3D) bit stack matrix with size M×N×2 wherein the width "N" is a product of the number of routing layers available in the bit stack design and the bit stack width and the height "M" is based on the bit stack height;

adding any known blockages to the bit stack matrix to inhibit subsequent wiring channel and pin position allocations; and adding any known pin placements within the bit stack macros to restrict subsequent pin position and/or wiring channel assignments.

11. A method for automatically optimizing bit stack channel wiring for very large scale integrated (VLSI) bit stack design on a computer as recited in claim 10 wherein the step of assigning routing channels and pin placements in the bit stack matrix comprises the steps of:

retrieving a next pin-pair from the ordered pin-pairs until all pinpairs are processed;

determining if a first pin in a retrieved pin-pair has already been placed within its corresponding instance, and if so, the "optimal" placement is found by searching the pin's macro for the first available pin rail, a pin rail being a horizontal row with no existing pins, the search beginning at the top of the macro and moving downwards to the bottom of the macro, and if no empty rows are found due to blockage or existing pins, defining a pin rail to be a partially available row;

allocating a horizontal pin rail to the pin;

determining if a second pin of the pin-pair has already been placed within its corresponding instance, and if so, the "optimal" placement of the second pin is found by searching the pin's macro for the first available pin rail, the search beginning at the bottom of the macro and moving upwards to the top of the macro;

allocating a pin rail to this pin;

determining whether this pin-pair's net has already been assigned to a vertical wiring channel, and if the pin-pair's net has not been assigned to a vertical wiring channel, a search is made for the first available vertical wiring channel that spans between the pins;

assigning the net associated with this pin-pair to the next available wiring channel.

12. A computer system for very large scale integrated (VLSI) circuit design which, for a given fixed ordering of a set of bit stack macros and a definition of interconnected nets, determines a pin placement and channel allocation within bit stack macros such that a minimum number of wiring channels are consumed, said computer system comprising:

means for prioritizing nets by length with longest nets having highest priority;

means for routing nets between appropriate macros according to their priority; and means for dynamically assigning pin rails as the nets are being placed with a preference towards a nearest edge of a macro in order to minimize net length and maximize sharing of wiring channels among multiple nets.

13. A computer system for very large scale integrated (VLSI) circuit design as recited in claim 12 wherein at least some of the bit stack macros have variable pin placements and the means for dynamically assigning assigns pin positions within macros with variable pins such that the number of wiring channels required is minimized.

* * * * *